United States Patent
Luk

(10) Patent No.: US 7,409,620 B2
(45) Date of Patent: Aug. 5, 2008

(54) SIMPLIFIED HIGH SPEED TEST SYSTEM

(76) Inventor: Fong Luk, 216 Sweet Rd., Alameda, CA (US) 94502

( * ) Notice: Subject to any disclaimer, the term of this patent is extended or adjusted under 35 U.S.C. 154(b) by 161 days.

(21) Appl. No.: 11/290,373

(22) Filed: Nov. 29, 2005

(65) Prior Publication Data

US 2006/0156146 A1    Jul. 13, 2006

Related U.S. Application Data

(60) Provisional application No. 60/631,640, filed on Nov. 29, 2004.

(51) Int. Cl.
*G01R 31/28* (2006.01)
*G06F 11/00* (2006.01)

(52) U.S. Cl. .................. 714/742; 714/701; 714/703; 714/738

(58) Field of Classification Search ............ 714/701, 714/703, 742, 738, 724; 365/200, 201
See application file for complete search history.

(56) References Cited

U.S. PATENT DOCUMENTS

| 6,671,844 | B1* | 12/2003 | Krech et al. ............. 714/736 |
| 6,971,045 | B1* | 11/2005 | Deb et al. ................ 714/30 |
| 7,035,755 | B2* | 4/2006 | Jones et al. .............. 702/121 |
| 2004/0078612 | A1* | 4/2004 | Kanapathippillai et al. . 713/324 |

* cited by examiner

*Primary Examiner*—Phung M Chung
(74) *Attorney, Agent, or Firm*—Bo-In Lin

(57) ABSTRACT

A method for configuring a testing system that includes a step of connecting a commercially available computer (CACMP) for directly controlling transmission of a plurality of test vectors to a test head. The method further includes a step of connecting a test vector memory between the CACMP and the formatter unit (FTM) with response unit (RP) for providing a required data width for storing the test vectors therein.

8 Claims, 2 Drawing Sheets

SIMPLIFIED HIGH SPEED TEST SYSTEM

This application is a Formal Application and claims priority to pending U.S. patent application entitled "SIMPLIFIED HIGH SPEED TEST SYSTEM" filed on Nov. 29, 2004 and accorded Ser. No. 60/631,640 by the same Applicant of this Application, the benefit of its filing date being hereby claimed under Title 35 of the United States Code.

BACKGROUND OF THE INVENTION

1. Field of the Invention

This invention relates generally to the method and system of testing the integrated circuits (ICs), electronic components and systems. More particularly, this invention relates to an simplified system configuration and method for testing the integrated circuits, electronic components and systems by employing a computer and taping signal from the data path between the CPU and the memory or other peripheral storage to significantly reduce the cost by eliminating the requirement to custom build a high-speed controller specifically for controlling the testing processes as that required in the conventional testing systems.

2. Description of the Prior Art

As the integrated circuits (ICs), electronic components and systems become more complicate with higher level of integration and increasingly faster operational speed, the traditional techniques of test system architecture configurations and methods are challenged by many technical difficulties. One of the major difficulties is the requirement of a high-speed controller (HSC) to control and manage the data transfer and test data verifications and to coordinate other necessary test related processes. Due to the performance requirements of speed and data handling capabilities, this high-speed controller is quite complicate. The whole system is build by assembling many different kinds of high-performance integrated circuits (ICs) according to the designs and system architectures generated by very sophisticate design teams. The high-speed controller thus becomes an expensive item that leads to a very high production cost and development engineering cost of the testing system.

FIG. 1 is a functional block diagrams for showing the system configuration of a conventional test high-speed teat system. The conventional test system 10 is configured for testing a device under test 15 using a test head 20 receiving data from formatter and timing unit (FTM) 25. The test results are sent to a response unit (RP) 30 that includes an exclusive OR circuit for comparing the test results from the test head 20 and the test patterns with variable timing strobes sent from the FTM 25. In the conventional architecture, the high speed testing system includes a background computer BGCMP 50 for loading data to and from a local high speed memory LM 35 and performs other functions such as user interface and other background tasks. The testing system 10 further includes a high speed controller 40 to control the high speed local memory 35 to send the test patterns to FTM and RP.

Due to the rapid development of very large-scale integrated circuit (VLSI) and system on chip (S.O.C) technology, the extreme circuit complexity of state of art VLSI and S.O.C. has required high speed processing capability of the high speed controller and a high speed large LM. The efforts spent in designing and producing a high speed controller and a high speed large local memory (LM) become a major cost in designing and building a conventional high speed testing system as that illustrated in FIG. 1.

Therefore, there is still a demand in the art of IC testing for a new and simplified system configuration to reduce the design and production cost of a high-speed testing system.

SUMMARY OF THE PRESENT INVENTION

It is therefore an aspect of the present invention to provide a simplified IC testing s system configuration to overcome the aforementioned difficulties encountered in the prior art.

Specifically, it is an aspect of the present invention to provide a simplified testing configuration by replacing a test-system specific high speed controller and/or the LM used in the conventional as part of the conventional system configuration with a computer that is commercially available or in the form of IP, Cell library etc. as designated in this Patent Application as commercially available computer (CACMP) and can be implemented at a much lower price. There are many high performance CACMP available at a minimum price so it will be much more cost effective, powerful and flexible to implement that the test-system specific high speed controller required in the conventional testing systems.

Another aspect of the present invention is to provide a new test vector memory that has many banks controlled by a memory select logic for reading and writing data from different data banks with sufficient data width to accommodate testing of high pin count testing systems.

These and other objects and advantages of the present invention will no doubt become obvious to those of ordinary skill in the art after having read the following detailed description of the preferred embodiment, which is illustrated in the various drawing figures.

DETAILED DESCRIPTION OF THE PREFERRED EMBODIMENT

Figure 1:
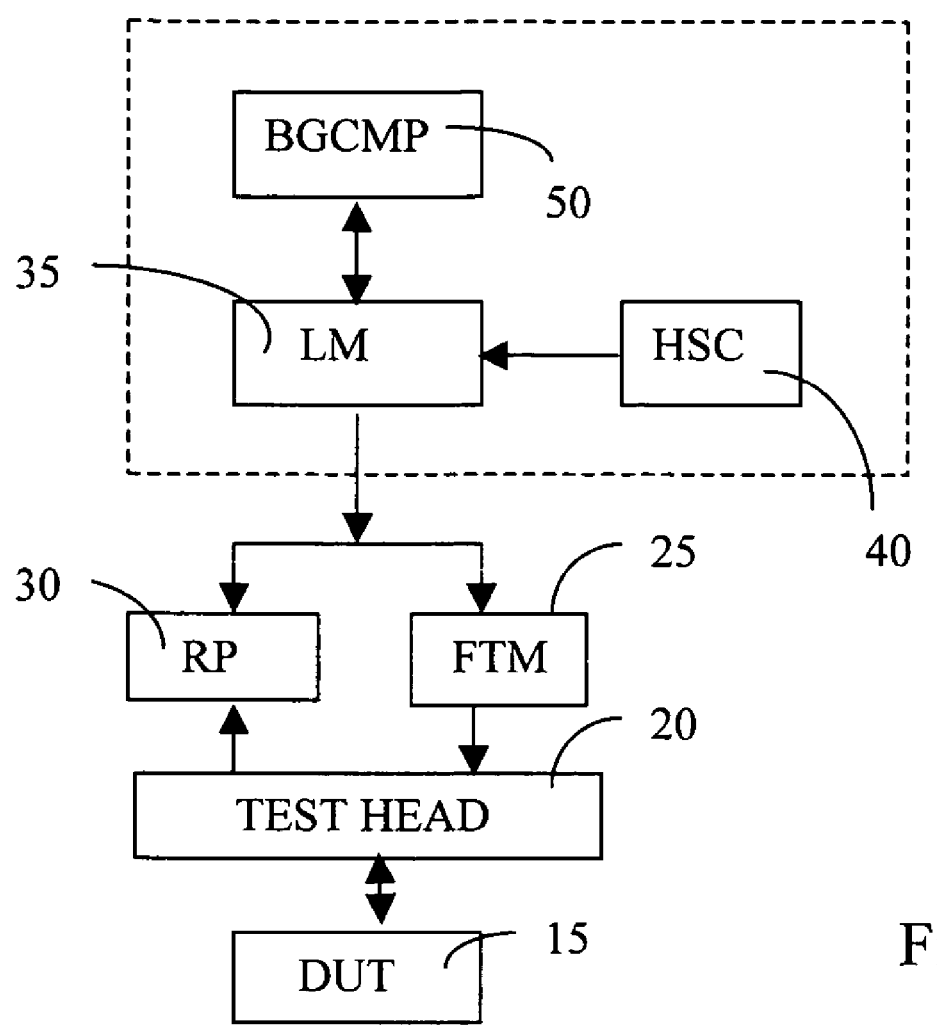
FIG. 1 is a functional block diagram showing a conventional high-speed testing system.
Figure 2:
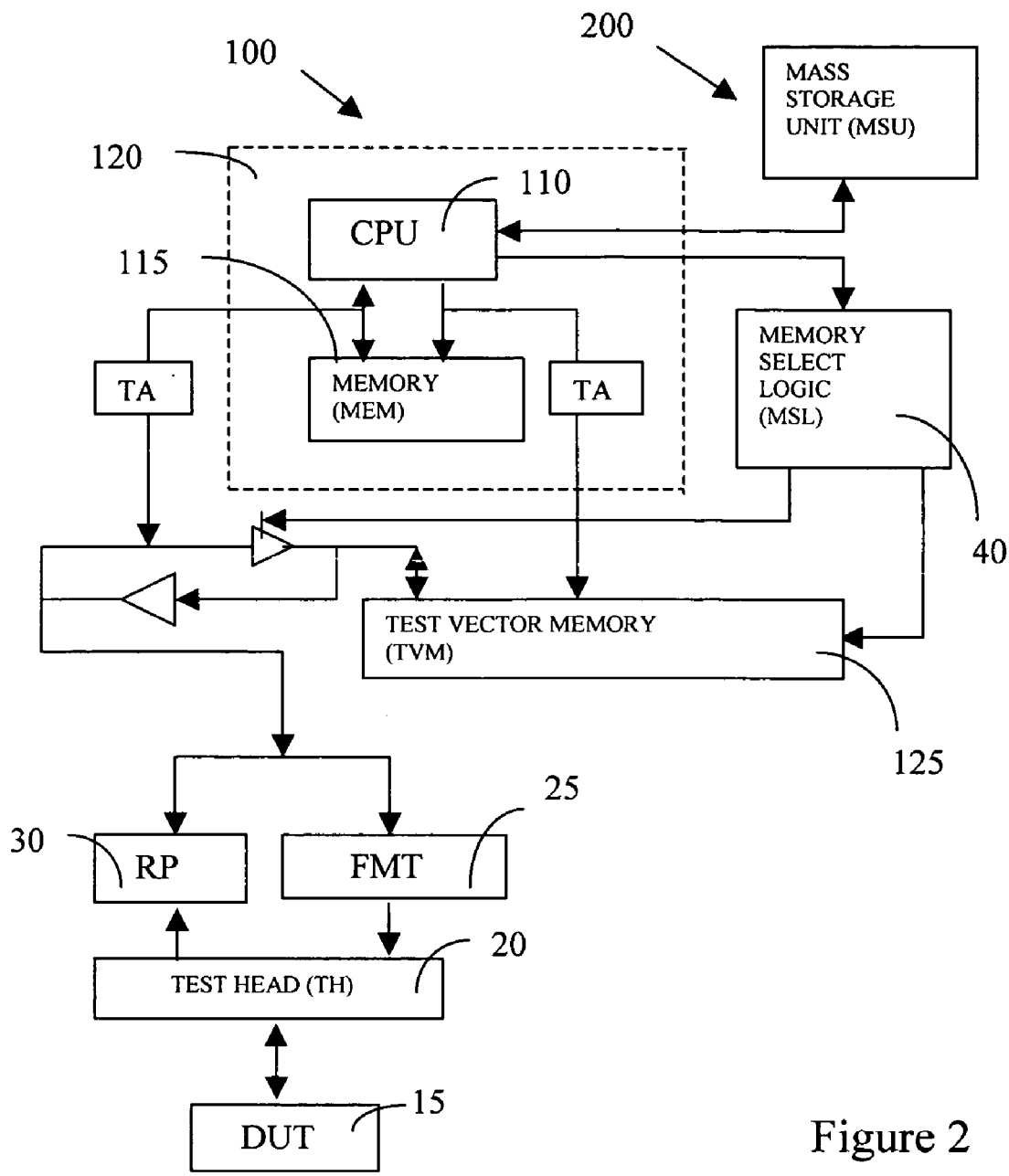
FIG. 2 is a functional block diagram showing a simplified system configuration for a high-speed testing system of this invention.

The present novel invention is different and totally non-obvious when compared to the conventional system by employing a commercially available computer (CACMP) to replace and to perform all the functions as previously carried out by the testing-system specific customized high-speed controller. As shown in FIG. 2, a simplified testing system 100 of this invention includes a CACMP 120 that has a central process unit (CPU) 110 and a memory 115. CACMP 120 is employed to perform the functions previously performed by the high-speed controller and may also be employed to perform the functions that performed by the background computer. CPU 110 read data are captured from the data path between the CPU 110 and the memory (or any storage device) 115 to be used as test vector data so that the conventional high-speed controller and high speed local memory are no longer required. The data path between the CPU 110 and the memory 115 can be a CPU local memory bus, a PCI bus, or other kinds of data paths. For some configuration, another background computer may be necessary so that CACMP can be dedicated to manage the tasks required for the test. Under such circumstances, the costs involved in two CACMP that are usually commercially available would be much more economical and easy to implement then to design a test specific high speed controller as that required in the conventional testing systems.

The test vectors are stored in the memory (or any storage device) 115 of CACMP 120. The CPU 110 issued a memory read instruction the test vector data becomes available in the data path between the memory (or any storage device) 115 and the CPU 110 and available for transmitting to the formatter and timing unit (FTM) for conducting the tests.

Test data width of the memory (or any storage device) 115 within a general-purpose computer 120 may be 32 or even 64 bits but the width is too small for high pin-count testing system. In order to accommodate high pin-count testing systems, a test vector memory which can be of any storage device 125 is provided that large data width and divided into many banks. A memory select logic 130 is connected between the CPU 110 and the test vector memory (or any storage device) 125 The CPU memory address bus, or an input/output (I/O) address bus associated control signals 140 is used to drive the test vector memory for data write from the CPU and the memory select logic is applied to select a specific data bank for storing the text vector in the test vector memory 125. After the test vectors are stored in the test vector memory 125, The CPU 110 enables the data bus driver and issues instruction to read from the test vector memory address space and test vector data from 120 and 125 is transmitted to the FTM and the test head to drive the test head for conducting the tests.

Since the CPU 110 of the CACMP 120 can be programmed and controlled to issue almost unlimited variety patterns of read instructions such as looping and conditional branches etc, the CPU of the general purpose computer in this new architecture is even more powerful and flexible and more convenient to implement than the high speed testing system according to the conventional configurations.

According to FIG. 2 and above descriptions, this invention discloses a method for configuring a testing system that includes a step of connecting a commercially available computer (CACMP) 120 for directly controlling transmission of a plurality of test vectors to a test head by means of executing a test execution program (TEPGM), which simulates the conventional high speed controller by means of issuing CPU instruction to induce desired test vector (TV) from CUP memory (MEM) 115 (which can be a CPU local memory, CPI memory, other peripheral device or other storage device) on to CPU memory (MBUS) bus and then capture the data (,which is the TV) on the MBUS during the data transfer induced by the CPU instruction. The capture TV is then used for testing the device under test (DUT).

Furthermore, this invention discloses a device that further includes the CACMP 120 that includes a CPU 110, a mass storage unit (MSU) 200 and the CPU memory (MEM) 115 (which can be a CPU local memory, CPI memory, other peripheral device or other storage device), the formatter (FMT) 25 and the test head (TH) 20. Wherein the CPU 110, the memory (MEM) 115 and the FMT are interconnected with a CPU memory bus (MBUS), which can be a CPI bus or other type of bus. The test is carried out with the steps of the CPU 110 runs the test execution program (TEPGM), which first transfer test vector from mass memory storage unit into CPU memory MEM115. The TEPGM then instructs the CPU to reads test vectors TV from MEM 115 (or by other CPU instruction to make desire TV available on to the MBUS) and the FMT captures the test vector data on MBUS induced by the CPU instruction. After formatting the test vector TV (change timing delay and plus width ect.), FMT sends the formatted test vector data to the test head (TH) 20 to drive the device under test (DUT) 15 and make comparison with output from the the DUT 15.

In a preferred embodiment, the test apparatus further includes the test vector memory (TVM) 125, the memory selection logic (MSL) 40, the CACMP 120 including a CPU 110, the mass storage unit (MSU), the CPU memory (MEM) 115 (which can be a CPU local memory, CPI memory, other peripheral device or other storage other storage device), the formatter (FMT) 25 and the test head (TH) 20. Wherein the memory selection logic MSL 40 is connected to the TVM 125 and controlled by the TEPGM via the CPU 110, the TVM 125 has multiple banks of memory controlled by MSL 40 and has data input, data output, control line and address line. The data input, the control line and the address line of the TVM 125 are connected to the MBUS. The data output of the TVM 125 is transferred to the FMT 25, the mass storage unit MSU is connected to CPU memory MEM 115. The test processes includes the steps of TEPGM issues instructions to the CPU to enable one bank of the TVM 125 and transfer test vectors (TV) to the bank of TVM 125 from mass storage unit MSU 200 until all bands of TVM 125 are filled up with corresponding test vectors (TV). The TEPGM then instruct the CPU 110 to reads test vectors TV from MEM 115 (or by other CPU instruction to make desire TV available on to the MBUS) according to user test program. Since the address line and the control line of TVM are connected to that of MEM 115, data in the TVM are read out to be captured by the FMT 25 and the FMT 25 uses them to drive the test head (TH) 20 to test the the DUT 15.

In another preferred embodiment, the test system further includes the test vector memory (TVM) 125, the memory selection logic (MSL) 40, the CACMP 120 including a CPU 110, the mass storage unit (MSU) 200, the CPU memory (MEM) 115 (which can be a CPU local memory, CPI memory, other peripheral device or other storage other storage device), the formatter (FMT) 25 and the test head (TH) 20. Wherein the memory selection logic MSL 40 is connected to the TVM 125 and controlled by the TEPGM via the CPU 110, the TVM 125 has multiple banks of memory controlled by MSL 40 and has data input, data output, control line and address line. The data input, the control line and the address line of the TVM 125 are connected to the MBUS. The data output of the TVM 125 is transferred to the FMT 25, the mass storage unit MSU 200 is connected to CPU memory MEM 115. The testing process includes the steps of the TEPGM issues instructions to the CPU 110 to enable one bank of the TVM 125 and transfer test vectors (TV) to the bank of TVM 125 from mass storage unit MSU 200 until all bands of TVM 125 are filled up with corresponding test vectors (TV). Then, the TEPGM instructs the CPU 110 to reads test vectors TV from MEM 115 (or by other CPU instruction to make desire TV available on to the MBUS) according to user test program. Since the address line and the control line of TVM are connected to that of MEM 115, data in the TVM are read out to be captured by the FMT 25 and the FMT 25 uses them to drive the test head (TH) 20 to test the the DUT 15.

Although the present invention has been described in terms of the presently preferred embodiment, it is to be understood that such disclosure is not to be interpreted as limiting. Various alternations and modifications will no doubt become apparent to those skilled in the art after reading the above disclosure. Accordingly, it is intended that the appended claims be interpreted as covering all alternations and modifications as fall within the true spirit and scope of the invention.

I claim:

1. A testing system for testing a device under test (DUT), the testing system comprising:

a commercially available general purpose computer (CAGPCMP) comprises a central process unit (CPU) and a memory;

said CPU issuing instructions to execute a test execution program (TEPGM) to control a testing process of said device under test (DUT) and for inducing an output of test vectors (TV) from said memory wherein each of said test vectors having a data width conforming to said CAGPCMP; and a memory bus (MBUS) connected to said memory for capturing said test vectors each having said data width conforming to said CAGPCMP, wherein said test vectors are to be further processed for compatible with a pin-count of said DUT, whereby the testing system is simplified without requiring a dedicated test controller for controlling said testing system.

2. The testing system of claim 1 further comprising:

a test vector memory (TVM) for receiving and storing said test vectors each having a data width conforming to said CAGPCMP therein.

3. The testing system of claim 2 wherein:

said test vector memory (TVM) further comprises multiple banks for receiving and storing said test vectors therein; and said test system further comprising a memory select logic (MSL) controlled by said CPU for selectively transferring said test vectors into said multiple banks of said test vector memory.

4. The testing system of claim 1 further comprising:

a test vector memory (TVM) for receiving and storing said test vectors having said data width conforming to said CAGPCMP therein; and a formatter for receiving and formatting said test vectors from said test vector memory into a DUT test-required test vectors having a data width complied to a DUT test requirement compatible with said pin-count of said DUT.

5. The testing system of claim 4 further comprising:

a test head for applying said DUT test-required test vectors compatible with said pin-count of said DUT for testing said DUT.

6. The testing system of claim 1 further comprising:

a mass storage unit (MSU) for storing said test vectors each have a width conforming to said CAGPCMP and said MSU is further controlled by said CPU for transferring said test vectors stored therein to said memory upon executing of said test execution program.

7. A method for testing a device under test (DUT) by applying a testing system, the method comprising:

issuing test vectors from a commercially available general purpose computer (CAGPCMP), wherein each of said test vectors having a data width conform to said CAGPCMP for storing in a memory in said CAGPCMP; and rearranging said test vectors into test-required test vectors each having a data width compatible with a pin-count of said device under test (DUT) to a test head for testing said DUT whereby the testing system is simplified without requiring a dedicated test controller for controlling said testing system.

8. The method of claim 7 further comprising:

connecting a test vector memory between said CAGPCMP and said test head for rearranging and reformatting said test vectors into said test-required test vectors each having a data width compatible with a pin count of said DUT.

* * * * *